(12) United States Patent
Herr et al.

(10) Patent No.: US 7,868,645 B2
(45) Date of Patent: Jan. 11, 2011

(54) METHOD AND APPARATUS FOR BALLISTIC SINGLE FLUX QUANTUM LOGIC

(75) Inventors: Quentin P. Herr, Ellicott City, MD (US); James E. Baumgardner, Odenton, MD (US); Anna Y. Herr, Ellicott City, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 0 days.

(21) Appl. No.: 12/774,305

(22) Filed: May 5, 2010

(65) Prior Publication Data

US 2010/0237899 A1 Sep. 23, 2010

Related U.S. Application Data

(60) Division of application No. 12/437,510, filed on May 7, 2009, now Pat. No. 7,782,077, which is a continuation-in-part of application No. 11/956,293, filed on Dec. 13, 2007, now Pat. No. 7,724,020, which is a continuation of application No. 11/654,632, filed on Jan. 18, 2007, now abandoned.

(51) Int. Cl.
   *H03K 19/195* (2006.01)
(52) U.S. Cl. .................................... 326/4; 326/6; 326/7
(58) Field of Classification Search .................. 326/1–7
   See application file for complete search history.

(56) References Cited

U.S. PATENT DOCUMENTS 3,978,351 A * 8/1976 Zappe ............................ 326/5
4,117,354 A 9/1978 Geewala (Continued)

FOREIGN PATENT DOCUMENTS

EP 0467104 1/1992

(Continued)

OTHER PUBLICATIONS

Berns et al., "Coherent Quasiclassical Dynamics of a Persistent Current Qubit", *Physical Review Letters APS USA*, vol. 97, No. 15, pp. 150502, Oct. 13, 2006.

(Continued)

*Primary Examiner*—James H. Cho
*Assistant Examiner*—Jason M Crawford
(74) *Attorney, Agent, or Firm*—Tarolli, Sundheim, Covell & Tummino LLP

(57) ABSTRACT

In one embodiment, the disclosure relates to a single flux quantum (SFQ) signal transmission line powered by an AC power source. The AC power source supplies power to a transformer having a primary winding and a secondary winding. The primary winding receives the AC signal and the secondary winding communicates the signal to the SFQ transmission line. The transmission line can optionally include an input filter circuit for receiving the incoming SFQ pulse. The filter circuit can have a resistor and an inductor connected in parallel. In an alternative arrangement, the filter circuit can comprise of an inductor. A first Josephson junction can be connected to the filter circuit and to the secondary winding. The Josephson junction triggers in response to the incoming SFQ pulse and regenerates a pulse signal in response to a power discharge from the secondary winding.

13 Claims, 19 Drawing Sheets

U.S. PATENT DOCUMENTS

| | | | |
|---|---|---|---|
| 4,117,503 A * | 9/1978 | Zappe | 327/528 |
| RE31,485 E * | 1/1984 | Faris | 326/3 |
| 4,626,701 A * | 12/1986 | Harada et al. | 327/367 |
| 4,916,335 A | 4/1990 | Goto et al. | |
| 5,099,152 A | 3/1992 | Suzuki | |
| 5,309,038 A | 5/1994 | Harada et al. | |
| 5,936,458 A * | 8/1999 | Rylov | 327/528 |
| 6,188,236 B1 | 2/2001 | Wikborg | |
| 6,507,234 B1 | 1/2003 | Johnson et al. | |
| 6,518,786 B2 | 2/2003 | Herr | |
| 6,549,059 B1 | 4/2003 | Johnson | |
| 6,724,216 B2 | 4/2004 | Suzuki et al. | |
| 6,750,794 B1 | 6/2004 | Durand et al. | |
| 6,865,639 B2 | 3/2005 | Herr | |
| 6,960,780 B2 | 11/2005 | Blais et al. | |
| 7,365,663 B2 * | 4/2008 | Rylov et al. | 341/133 |
| 7,498,832 B2 | 3/2009 | Baumgardner et al. | |
| 7,619,437 B2 * | 11/2009 | Thom et al. | 326/5 |
| 2002/0063643 A1 | 5/2002 | Smith et al. | |
| 2002/0190381 A1 | 12/2002 | Herr et al. | |
| 2003/0011398 A1 | 1/2003 | Herr | |
| 2003/0016069 A1 | 1/2003 | Furuta et al. | |
| 2003/0039138 A1 * | 2/2003 | Herr | 365/160 |
| 2003/0040440 A1 | 2/2003 | Wire et al. | |
| 2003/0115401 A1 | 6/2003 | Herr | |
| 2003/0183935 A1 | 10/2003 | Herr et al. | |
| 2004/0120444 A1 | 6/2004 | Herr | |
| 2004/0201099 A1 | 10/2004 | Herr | |
| 2004/0201400 A1 | 10/2004 | Herr | |
| 2005/0001209 A1 | 1/2005 | Hilton et al. | |
| 2005/0023518 A1 | 2/2005 | Herr | |
| 2005/0110106 A1 | 5/2005 | Goto et al. | |
| 2005/0224784 A1 | 10/2005 | Amin et al. | |
| 2007/0052441 A1 * | 3/2007 | Taguchi et al. | 326/3 |
| 2010/0033206 A1 * | 2/2010 | Herr et al. | 326/4 |

FOREIGN PATENT DOCUMENTS

| | | |
|---|---|---|
| WO | WO 2005/093649 | 10/2005 |
| WO | PCT/US2008/072017 | 8/2008 |
| WO | PCT/US2008/050864 | 11/2008 |

OTHER PUBLICATIONS

Garanin et al., Effects of nonlinear sweep in the Landau-Zener-Stueckelberg effect, *Physical Review B*, vol. 66, No. 17, pp. 174438-1-174438-11, Nov. 1, 2002.

Koch et al., A NRZ—Output Amplifier for RSFQ Circuits, , *IEEE Transaction on Applied Superconductivity*, vol. 9, No. 2, pp. 3549-3552, Jun. 1999.

Wulf et al., Dressed States of Josephson Phase Qubit Coupled to an LC Circuit, *iEEE Transaction on Applied Superconductivity IEEE USA*, vol. 15, No. 2, pp. 856-859, Jun. 2, 2005.

* cited by examiner

METHOD AND APPARATUS FOR BALLISTIC SINGLE FLUX QUANTUM LOGIC

This is a Divisional application of U.S. Ser. No. 12/437,510, filed May 7, 2009; now U.S. Pat. No. 7,782,007 the specification of which is incorporated herein in its entirety which is a Continuation-in-part of application Ser. No. 11/956,293 filed Dec. 13, 2007, now U.S. Pat. No. 7,724,020 which was a continuation of application Ser. No. 11/654,632, filed Jan. 18, 2007; now abandoned the specification of both applications are incorporated herein in their entirety.

BACKGROUND

1. Field of the Invention

The disclosure relates to a method and apparatus for providing single flux quantum logic gates. More specifically, the disclosure relates to providing merge gates, join gates, and dual-rail branch gates for processing single flux quantum (SFQ) pulses.

2. Description of Related Art

In the field of digital logic extensive use is made of well known and highly developed CMOS (complementary metal-oxide semiconductor) technology. As CMOS has begun to approach maturity as a technology, there is an interest in alternatives that may lead to higher performance efficiency in terms of speed, power computational density, interconnect bandwidth and the like.

An alternative approach to CMOS technology comprises superconductor-based single flux quantum circuitry, utilizing superconducting Josephson junctions, with typical signal power of around 4 nW, at a typical data processing rate of 20 Gb/s or greater. Such devices have operating temperatures of about 4.degree. K.

Superconductor devices based on the Josephson effect are replacing conventional devices based on semiconductor technology for high performance and low power. The superconductor devices are well known as a high-speed, low-power digital logic family and are scalable to very-large scale integrated (VLSI) circuits. Digital circuits that employ superconductor devices and are fabricated using present circuit fabrication technology operate at clock rates ranging between 10-100 GHz. Development of advanced superconducting devices require sophisticated Josephson junction logic gates that operate based on the superconducting principles. Therefore, there is a need for such advanced logic gates.

SUMMARY

In one embodiment, the disclosure relates to a single flux quantum (SFQ) signal transmission line powered by an AC power source. The AC power source supplies power to a transformer having a primary winding and a secondary winding. The primary winding receives the AC signal and the secondary winding communicates the signal to the SFQ transmission line. The transmission line can optionally include an input filter circuit for receiving the incoming SFQ pulse. The filter circuit can have a resistor and an inductor connected in parallel. In an alternative arrangement, the filter circuit can comprise of an inductor. A first Josephson junction can be connected to the filter circuit and to the secondary winding. The Josephson junction triggers in response to the incoming SFQ pulse and regenerates a pulse signal in response to a power discharge from the secondary winding.

In another embodiment, the disclosure relates to a rapid SFQ merge gate comprising a first input for receiving a first SFQ pulse and a second input for receiving a second SFQ input pulse. A first Josephson junction and a third Josephson junction are connected in parallel to the first input filter while a second Josephson junction and a fourth Josephson junction are connected in parallel with the second input filter. A first biasing circuit is provided for causing the first input pulse to reach the fourth Josephson junction and for preventing the first input pulse from reaching the second Josephson junction. Similarly, a second biasing circuit is provided for causing the second input pulse to reach the third Josephson junction and for preventing the second input pulse from reaching the first Josephson junction. An optional DC or AC power source can be added to power the circuit. Input and output filters can also be added to the merge gate.

In still another embodiment, the disclosure relates to a flux-powered logic gate having a first input for receiving a first input pulse and a second input for receiving a second input pulse. The first input is connected in parallel to a first Josephson junction and a third Josephson junction and the second input is connected in parallel to a second Josephson junction and a fourth Josephson junction. A first inductive path connects the first Josephson junction to the fourth Josephson junction and a second inductive path connects the second Josephson junction to the third Josephson junction. An optional output gate can be wired in parallel with the to the third and fourth Josephson junctions.

In still another embodiment, the disclosure relates to a flux-powered logic gate having 2×2 array of Josephson junctions and a pair of inductive paths formed between each opposing pair of Josephson junctions. The logic gate comprises: a first input gate for receiving a first input; a second input gate for receiving a second input; a first Josephson junction and a third Josephson junction connected in parallel; a second Josephson junction and a fourth Josephson junction connected in parallel; a first inductive path for providing a first loop inductance between the first Josephson junction and the fourth Josephson junction; a second inductive path for providing a second loop inductance between the second Josephson junction and the third Josephson junction; and an output gate for receiving a pulse transmitted from one of the first, second, third or fourth Josephson junctions. The first inductive path can prevent an input pulse received at the first Josephson junction to be directed to the second Josephson junction.

A method according to one embodiment to the disclosure comprises the steps of providing a first input pulse to a first input gate and directing the first input pulse from the first input gate to trigger a first Josephson junction. After triggering the first Josephson junction, the first input pulse is caused to trigger a fourth Josephson junction by biasing a second and third Josephson junctions. Similarly, a second input pulse is provided to a second input gate and triggers the second Josephson junction. By biasing the first and the fourth Josephson junctions, the second input pulse is caused to trigger the third Josephson junction and is then directed to the output gate.

In another embodiment, the disclosure relates to a method for powering an SFQ ballistic merge gate by implementing the steps of: (1) providing a first input pulse to a first input gate; (2) triggering a first Josephson junction using the first input pulse; (3) coupling the first Josephson junction to a fourth Josephson junction and directing the first input pulse from the triggered first Josephson junction through the coupling to the fourth Josephson junction; and (4) biasing a second Josephson junction and a third Josephson junction so as to direct the first input pulse from the first Josephson junction through a fourth Josephson junction to an output gate.

In still another embodiment, the disclosure relates to a dual branch gate having a first input filter for receiving a first input pulse and a second input filter for receiving a second input pulse. A first Josephson junction and a second Josephson junction are connected in parallel to the first input filter and a third Josephson junction and a fourth Josephson junction are connected in parallel to the second input filter. A first output node communicates with each of the first and the second inputs. A first biasing circuit causes the first input pulse to reach the first output node and prevents the first input pulse from reaching the second Josephson junction. The embodiments may optionally include a third input filter for receiving a third input pulse and a fifth and sixth Josephson junctions connected in parallel with the third input filter. A second output node communicates with the second input and the third input and a second biasing circuit causes the third input pulse to reach the second output node and prevents the third input pulse from reaching the fifth Josephson junction. The third input can optionally define an inverse pulse of the first input pulse.

In still another embodiment, the disclosure relates to a method for implementing a dual-rail branch gate. The method comprises the steps of: (1) providing a first circuit having a first filter, the first circuit having a first and a second Josephson junctions; (2) providing a second circuit having a second filter, the second circuit having a third and a fourth Josephson junctions; (3) receiving a first input pulse at the first circuit; (4) directing the first input pulse to the first Josephson junction and to an output gate using a first loop inductance through a first biasing circuit; (5) receiving a second input pulse at the second circuit; (6) directing the second input pulse to the fourth Josephson junction and to the output gate using a second loop inductance through a second biasing circuit; and (7) receiving the first input pulse and the second input pulse at an output gate.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Figure 1A:
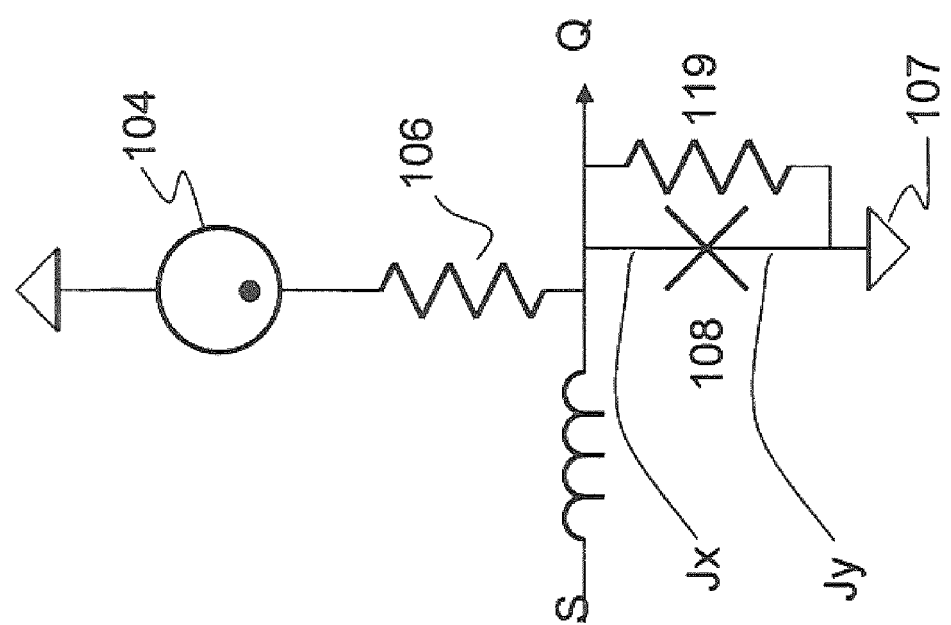
FIG. 1A shows a conventional Josephson transmission line.

FIG. 1A shows a portion of a conventional Josephson transmission line (JTL). JTL 100 of FIG. 1A, includes Josephson junction 108 designated by symbol "X" and having first and second terminals $J_x$ and $J_y$. A conventional Josephson junction is comprised of two layers of superconductor separated by a very thin layer of an insulator. When cooled to superconducting temperatures and biasing with a DC current from source 104 below a certain critical current Ic, the Josephson junction is superconducting and conducts current without developing a voltage drop and exhibiting substantially no electrical resistance.

When an input voltage pulse signal, called a single flux quantum (SFQ) pulse, derived from a previous superconducting circuit is applied, sufficient signal current is supplied to attain the critical current, which causes the Josephson junction to trigger or flip (by generating a transient voltage pulse). The flipping generates a single flux quantum output pulse in response to the single flux quantum input pulse. Such circuits may be used to feed a plurality of subsequent circuits for impedance matching purposes.

In FIG. 1A, a DC bias current is supplied to Josephson junction 108 via terminal 104 through resistor 106 and flows to ground 107. Then the critical current Ic through Josephson junction 108 is attained, an output pulse is generated at output terminal Q. The DC current through resistor 106 represents an unwanted static power dissipation which generates objectionable heat. To compensate for this heat, additional cooling requirements must be supplied to the superconducting circuit.

Figure 1B:
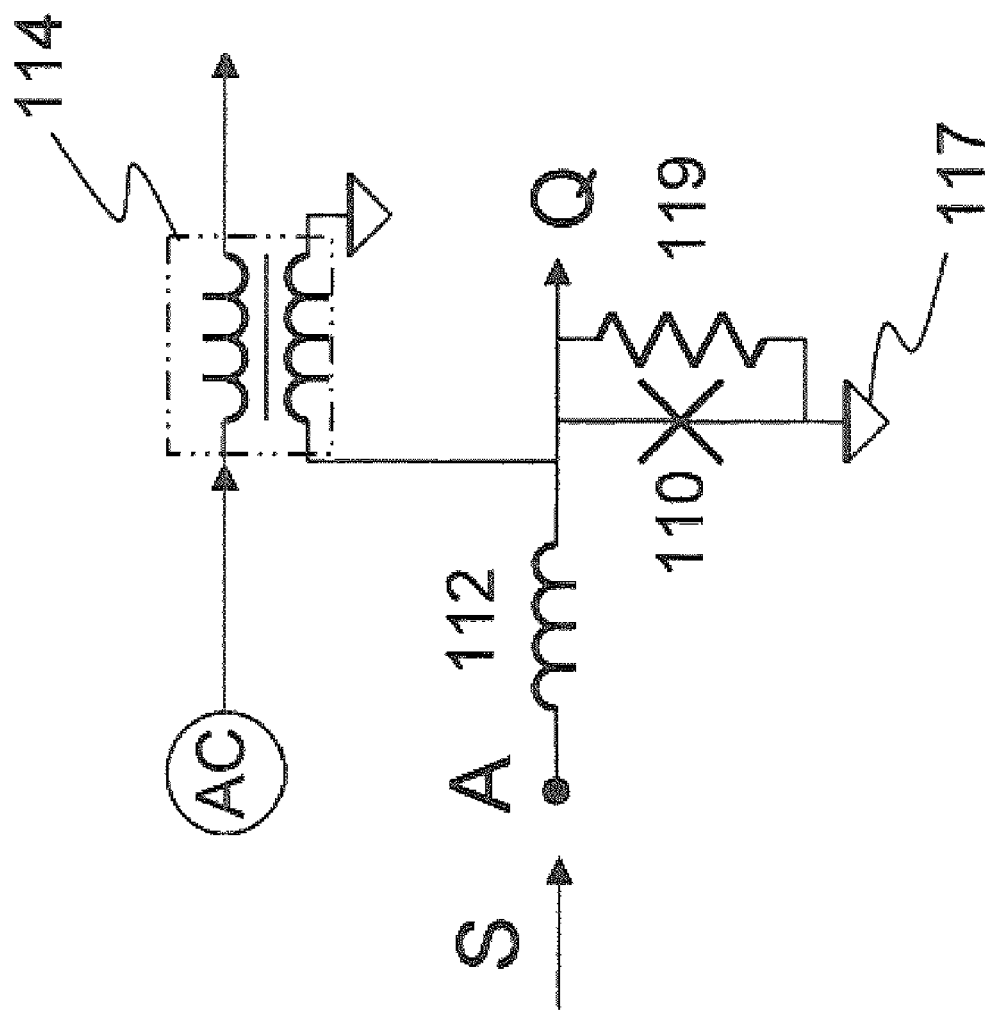
FIG. 1B shows a flux-powered Josephson transmission line.

FIG. 1B illustrates a flux-powered JTL according to one embodiment of the disclosure. JTL 110 of FIG. 1B includes AC power source and transformer 114 which completely eliminates the requirement for heat dissipating resistor 106. The circuit of FIG. 2 includes Josephson junction 110 which is connected to ground 117. Josephson junction 110 and shunt resistor 119 are connected in parallel as in FIG. 1A. Shunt resistor 119 dampens the harmonics which ring through the circuit.

Similar to the circuit of 1A, the flux-powered JTL includes an input terminal which receives input signal S connected to Josephson junction 118 through inductor 112. Inductor 112 defines an input inductor or an input filter. JTL 110 includes output terminal Q. Circuit 110 provides a biasing arrangement devoid of any resistors. Instead, it includes a superconducting biasing transformer 114 having primary and secondary winding Lp and Ls. An AC bias current is applied across terminals $t_1$ and $t_2$ of transformer 20.

By way of example, the AC bias circuit can provide a trapezoidal waveform. The bias current from secondary winding Ls is supplied to Josephson junction 110 at a current value less than Ic. At a time when AC power is supplied to circuit 110, an input voltage pulse can be applied to the input terminal A. When the critical current $I_c$ is attained, Josephson junction 110 flips and an output pulse is generated at output terminal Q.

A reverse current through the Josephson junction would reset the junction for subsequent flipping. This can be accomplished through the trailing edge of the input waveform which supplies reverse current through Josephson junction 110. The reverse current causes the junction to flip, providing an output pulse and sending current back in the other direction to effectively cancel the current due to the prior flipping of the junction. Thus, the circuit is ready for the next input pulse.

Figures 1C, 1D:
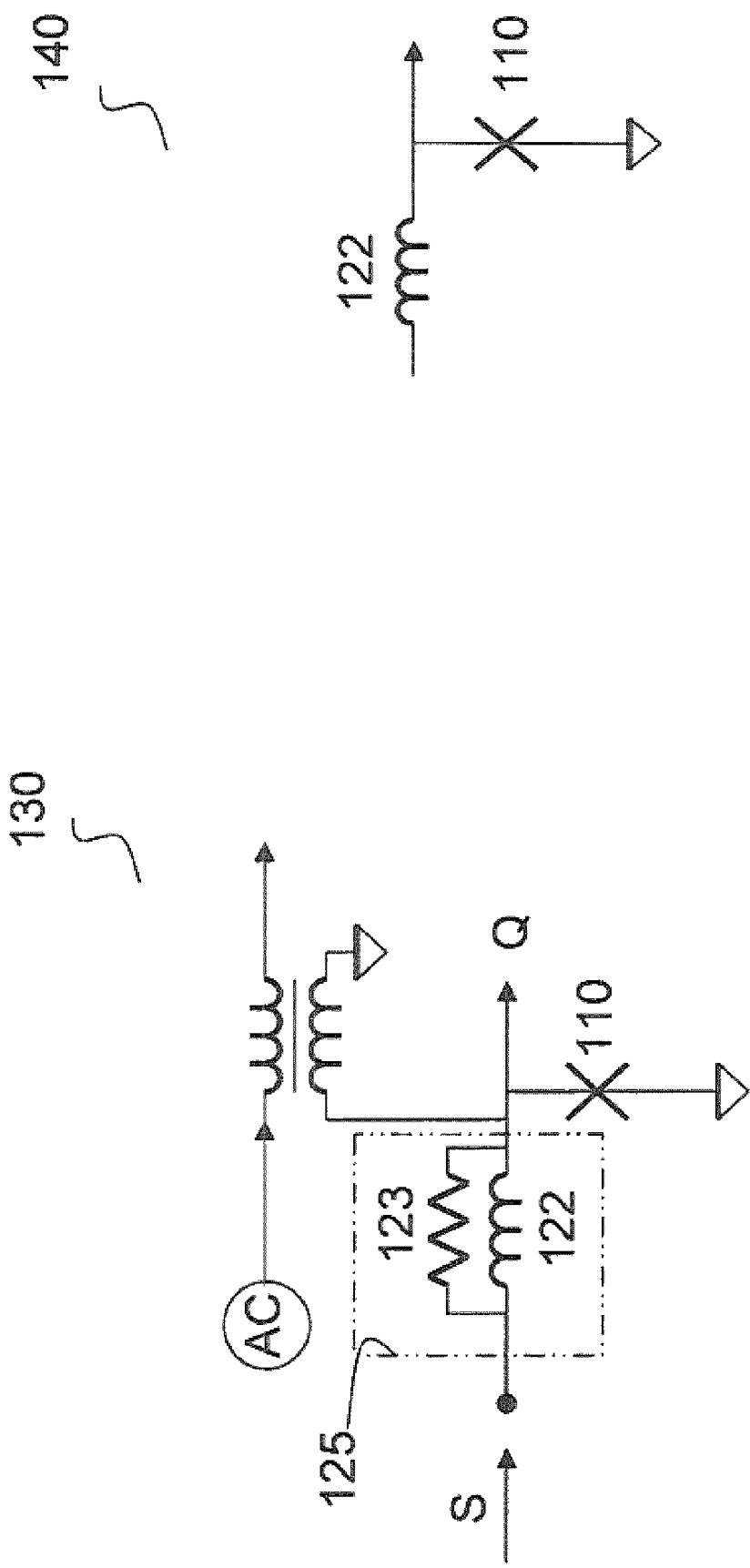
FIG. 1C shows a partially ballistic Josephson transmission line.
FIG. 1D shows a fully ballistic JTL according to another embodiment of the disclosure in which resistive damping and bias supply are eliminated.

FIG. 1C shows a partially ballistic JTL 130 according to an embodiment of the disclosure. In FIG. 1C, the shunt resistor (see resistor 119 in FIG. 1B) is removed to reduce heat dissipation. In its place input filter 125 is provided to receive the incoming signal. Input filter 125 comprises resistor 123 and inductor 122 connected in parallel. In a transmission line having a plurality of JTLs 130, only about 10% of the signal energy is lost at each JTL stage of the line.

FIG. 1D shows a fully ballistic transmission line according to another embodiment of the disclosure in which resistive damping and bias supply are eliminated. As compared with the JTL circuits of FIGS. 1B and 1C, the fully ballistic JTL 140 lacks power source, input filter and shunt resistor. Because JTL 140 lacks a shunt resistor, it produces no resistive dissipation. Consequently, JTL 140 behaves similar to a passive transmission line when a plurality of JTL 140 stages are coupled in series. To address possible damping (or simple harmonics) in a circuit having a plurality of JTLs stages, a dampening resistor can be added after, for example, 100 or 1,000 JTLs.

Figure 2A:
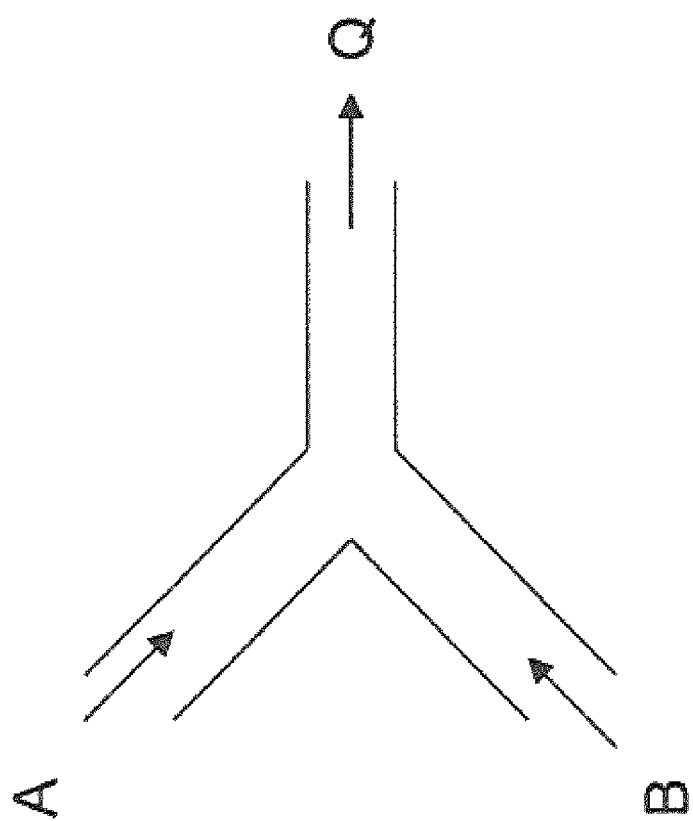
FIG. 2A symbolically shows a conventional merge gate.

FIG. 2A symbolically shows a conventional merge gate. A merge gate is the building block of a logic circuit. In the representation of FIG. 2A, SFQ pulse A and SFQ pulse B are supplied to the merge gate 200 and pulse Q is provided as output. Output Q represents a combination of A and B pulses not an addition of the two. That is, output pulse Q contains the pulses from each of input pulse A and input pulse B.

Figure 2B:
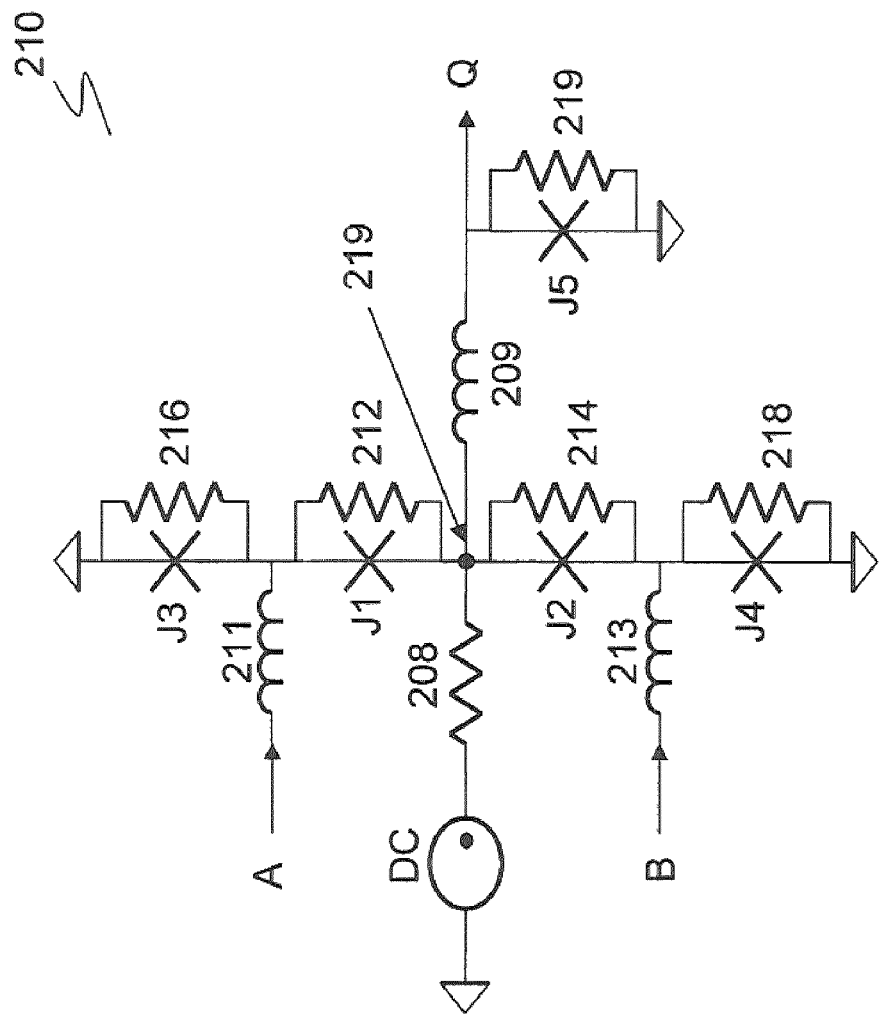
FIG. 2B shows a conventional rapid-SFQ merge gate.

FIG. 2B shows a conventional rapid-SFQ gate. The structure of the merge gate can be used to configure reversible, dual branch and join gates as illustrated below. In circuit 210 of FIG. 2B, input pulse A is directed to input inductor 211 and input pulse B is directed to input inductor 213. Inductors 211 and 213 are input filters. Josephson junctions $J_2$ and $J_3$ are connected in parallel to inductor 211. Josephson junction $J_2$ and $J_4$ are connected in parallel to inductor 213. Each of Josephson junctions $J_1$, $J_2$, $J_3$, $J_4$ and $J_5$ is coupled to one of resistors 212, 214, 216, 218 and 219, respectively. The parallel coupling of a Josephson junction to a resistor dampens the harmonic ringing. An SFQ pulse directed to input A travel through inductor 211, Josephson junction J, central node 219 and escape junction 209 before reaching output Q. A disadvantage of the circuit 210 is the heat dissipation through resistor 208. Another disadvantage is that pulses A and B cannot be entered simultaneously because the pulses would combine into a single pulse at the output Josephson junction 219.

Figure 2C:
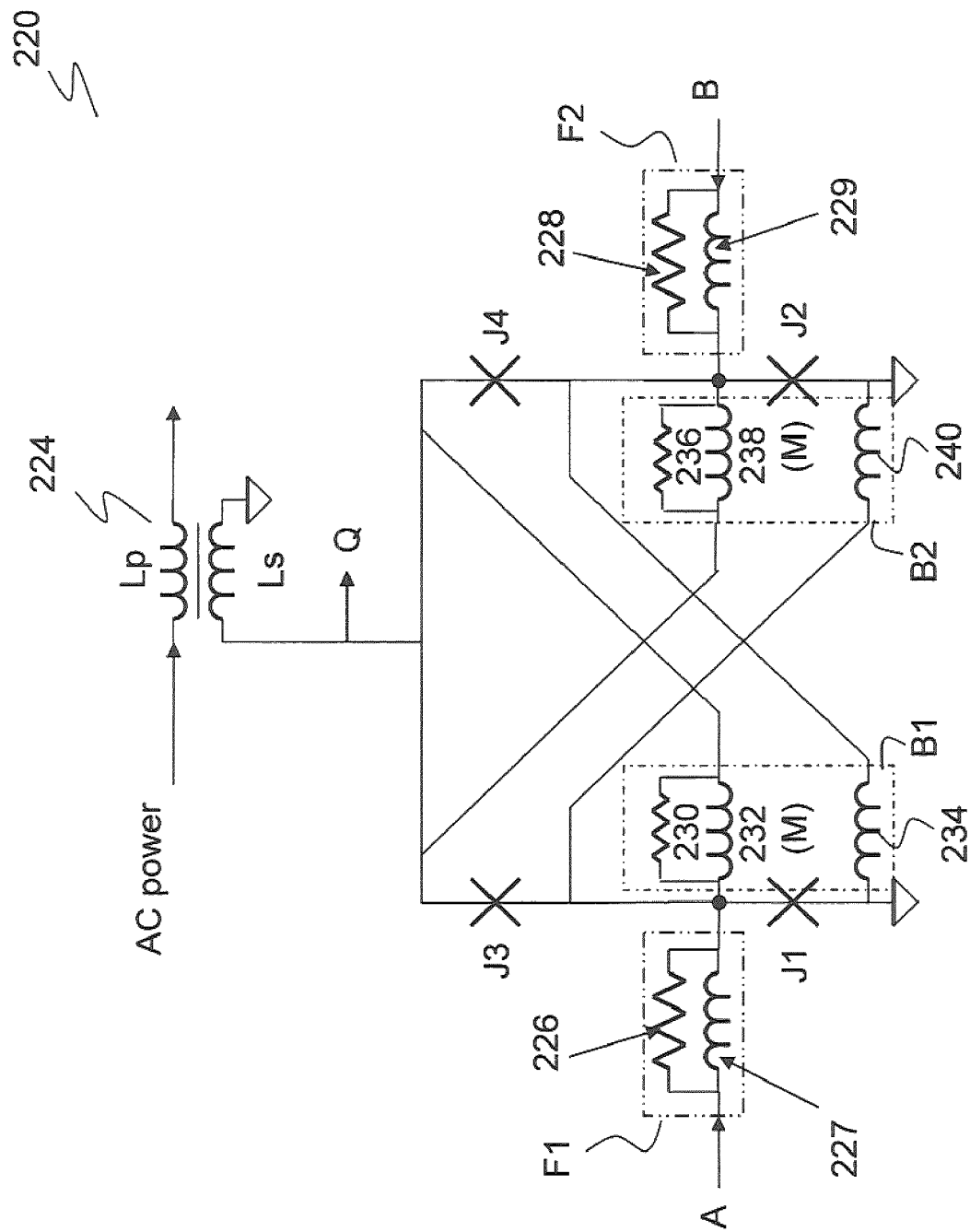
FIG. 2C shows a ballistic merge gate according to one embodiment of the disclosure.

FIG. 2C shows a ballistic merge gate according to one embodiment of the disclosure. In FIG. 2C, input pulse A is provided to filter F1. As stated, the input pulse may define an SFQ pulse. Filer $F_1$ comprises inductor 227 and resistor 226 connected in parallel. Input pulse B is supplied to filter $F_2$. Filter $F_2$ comprises resistor 228 and inductor 229. Output Q provides the merged output of inputs A and B as described in relation to FIG. 2A. AC power is provided to the circuit through a transformer 224 having primary winding $L_P$ and secondary winding $L_s$.

Loop transformers $B_1$ and $B_2$ are interposed between inputs A and B. Each loop transformer comprises a resistor and two inductors. For example, in loop transformer $B_1$ inductor 234 is positioned to form mutual inductance with inductor 232. Similarly, in loop transformer $B_2$ inductor 238 is positioned to form mutual inductance with inductor 240. Since Josephson junctions $J_1$, $J_2$, $J_3$ and $J_4$ are positioned between inputs A and B, loop transformer $B_1$ and $B_2$ function to guide the input pulse to the desired Josephson junction. In the embodiment of FIG. 2C, loop transformers are used to bias movement of the input pulse. However, the principles disclosed herein are not limited to using loop transformers and other means of biasing the flow of SFQ pulse through the circuit can be used without departing from the principles of the invention.

For example, with reference to circuit 220, loop transformer $B_1$ causes an input pulse from input A to reach $J_4$ (after triggering $J_1$) and prevents the input pulse from reaching $J_2$. This path will be implemented if the signal path has consistent impedance. The explicit inductance of loop transformer $B_1$ interconnect is less than the Josephson inductance of the junctions. The Josephson inductance to ground from node Q through $J_1$-$J_4$ is the same as the Josephson inductance of a single junction. Thus, input A will trigger $J_1$. The additional element $B_1$ causes $J_1$ to trigger $J_4$. This both propagates the signal at A to Q, and inhibits the signal from propagating to input B.

If circuit 220 was designed without the interconnection of loop transformer $B_1$ and $B_2$, an input pulse to A would trigger $J_1$ only and no additional junctions would be triggered. To propagate the pulse from A to Q without triggering $J_2$ or $J_3$, loop transformer $B_1$ is provided. The two inductors of loop transformer $B_1$ can be relatively large. However, the loop inductance of loop transformer $B_1$ is preferably similar in value to that of inductor 227. This provides constant impedance between $J_1$ and $J_4$, causing $J_4$ to be triggered after $J_1$ The final requirement after $J_4$ has been triggered, is to force propagation from $J_4$ to Q. In one embodiment of the disclosure this is accomplished with the AC power which puts bias current through junctions $J_1$, $J_2$, $J_3$, $J_4$ to ground. When input A triggers $J_1$ the current makes it energetically more favorable for $J_4$ to be triggered and less favorable for $J_3$ and $J_2$ to be triggered. The bias current can be very small as it only needs to steer the pulse to one of two otherwise equally favorable paths. However, the bias current puts power into the system, which means that it may be fully reversible in the strictest sense. The need for bias current is predicted by reversible computing theory, which states that the merge gate cannot be reversible because information is lost in the merge operation.

Similarly, loop transformer $B_2$ causes an input from input B to reach the third Josephson junction and prevents the second input pulse from reaching the first Josephson junction. An input pulse at input A is filtered through input filter $F_1$, and is then directed to output Q through $J_1$ and $J_4$. An input pulse at input B is filtered through input filter $F_2$, and is then directed to output Q through $J_2$ and $J_3$. The loop transformer circuits provide low inductance coupling between successive Josephson junction elements. A path from A to Q bypasses the escape junction to avoid a high inductance value. In other words, the loop transformer prohibits the flow of an SFQ pulse from input A to input B.

In one embodiment of the disclosure, the data encoding provided by circuit 220 of FIG. 2C is reciprocal. That is, each positive SFQ pulse followed by a negative SFQ to account for the AC power supply and because of the transformers positioned at the gates.

The embodiment of FIG. 2C is advantageous over the prior art circuit of FIG. 2B for the reasons that it avoids static heat dissipation (see resistor 208, FIG. 2B) and reduces signal heat dissipation (see resistors 212, 214, 216, 218 and 219, FIG. 2B).

Another embodiment of the disclosure relates to a reversible join gate. In one embodiment of the disclosure, the join gate includes four co-joined merge gate structures in a manner to provide an eight-fold symmetry. In any such join gate, any single input can have two possible output paths that are equally favorable. With dual rail encoding, however, there are always two adjacent inputs and it is favorable for the two inputs to follow the paths to the mutual output. There is one output signal for every two input signals. Energy is conserved because the output has twice the energy of the input.

The gate is reversible in the sense that energy dissipation in the gate may be arbitrarily smaller than signal energy. The gate is also reversible in the sense that inputs and outputs are interchangeable. That is, the signals applied to the inputs propagate in the outputs, but signals applied to the outputs will likewise propagate to the inputs.

Figure 3A:
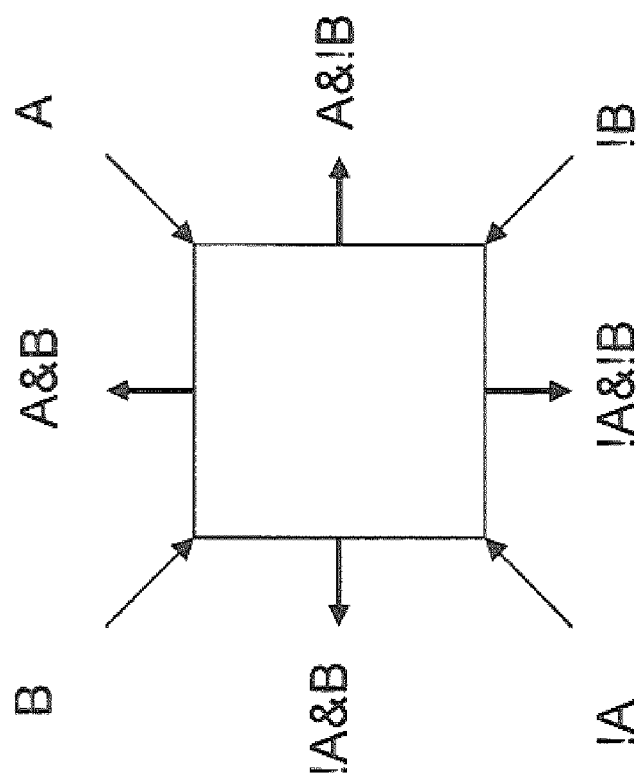
FIG. 3A is a symbolic representation of a reversible dual rail logic join gate.

FIG. 3A shows a branch symbol for a reversible dual rail logic join gate. The branch circuit of FIG. 3A has inputs A, B, A! and B!. The outputs include A&B, A&!B, !A&!B, !A&B. The logic of operation of a join gate is similar to that of a branch gate in that: inputs and outputs are reversed relative to the merge gate; signal encoding is dual rail; the gate is theoretically fully reversible; certain of the Josephson junctions may be removed if transformer coupling constant approaches unity and power (as in the merge gate) may be used but is not required.

Figure 3B:
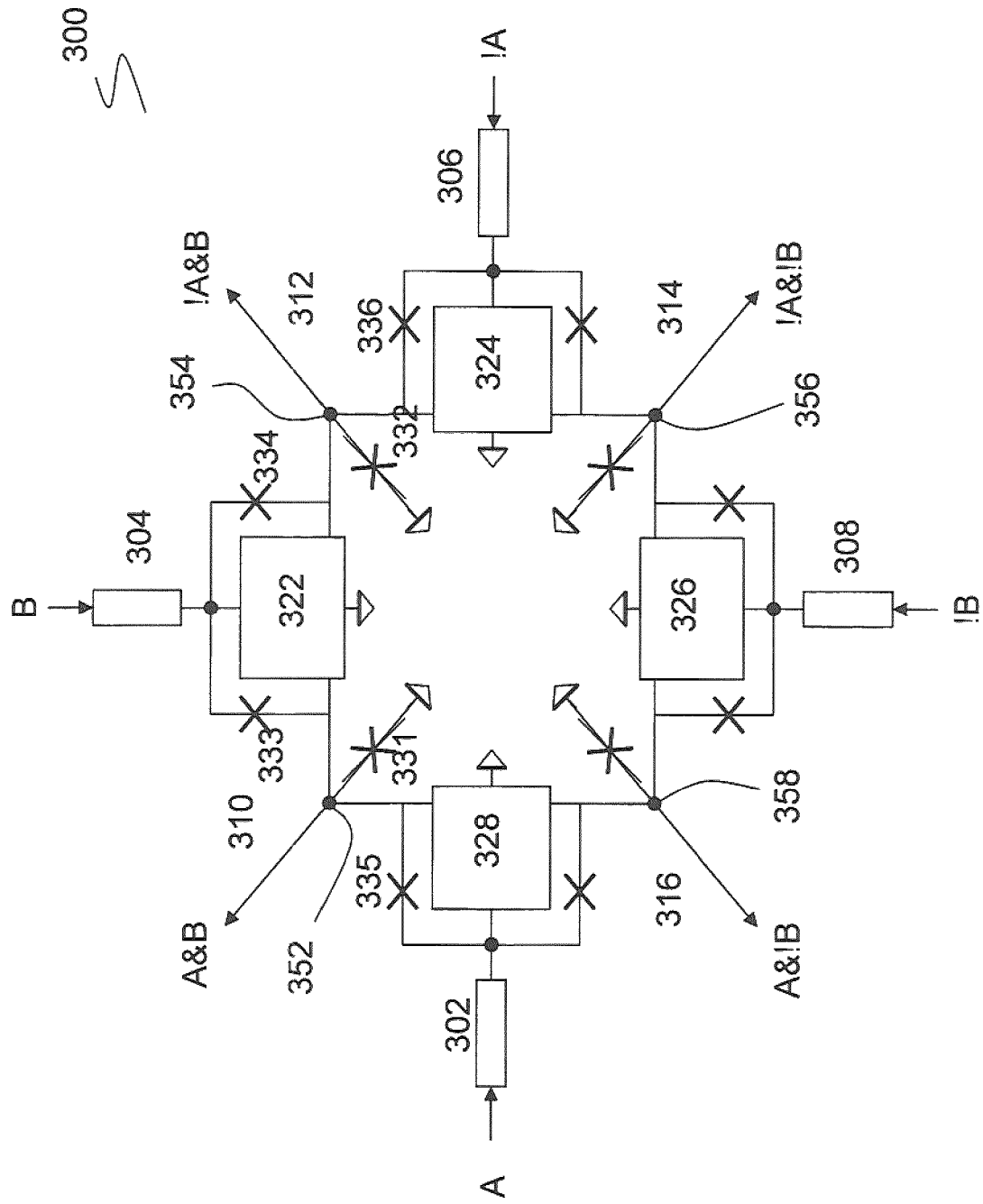
FIG. 3B is a schematic representation of a ballistic dual-rail join gate according to one embodiment of the disclosure.

FIG. 3B is a schematic representation of a ballistic dual-rail join gate according to one embodiment of the disclosure. Circuit 300 of FIG. 3B receives inputs A, B, !A and !B and provides output s A&B, !A&B, !A&!B and A&!B. Input filters 302, 304, 306 and 308 are positioned to receive SFQ pulses A, B, !A and !B, respectively. Output filters 310, 312, 314 and 316 are positioned at each output node and correspond, respectively to outputs A&B, !A&B, !A&!B and A&!B. Josephson junctions 331, 332, 333, 334, 335 and 336 are positioned at the top half of circuit 300.

The six Josephson junctions are arranged in 2.times.2 series/parallel arrays to produce constant inductance/impedance environment between the input and output gates. Transformers 322, 324, 326 and 328 also connect the inputs to the output with constant inductance/impedance.

Although not required, power may be supplied to circuit 300. AC power can be supplied with a transformer as shown in the previous embodiments. In an alternative embodiment, DC power can be supplied with a resistor. The top-half of circuit 300 is duplicated on the bottom-half for dual rail data encoding.

Figure 3C:
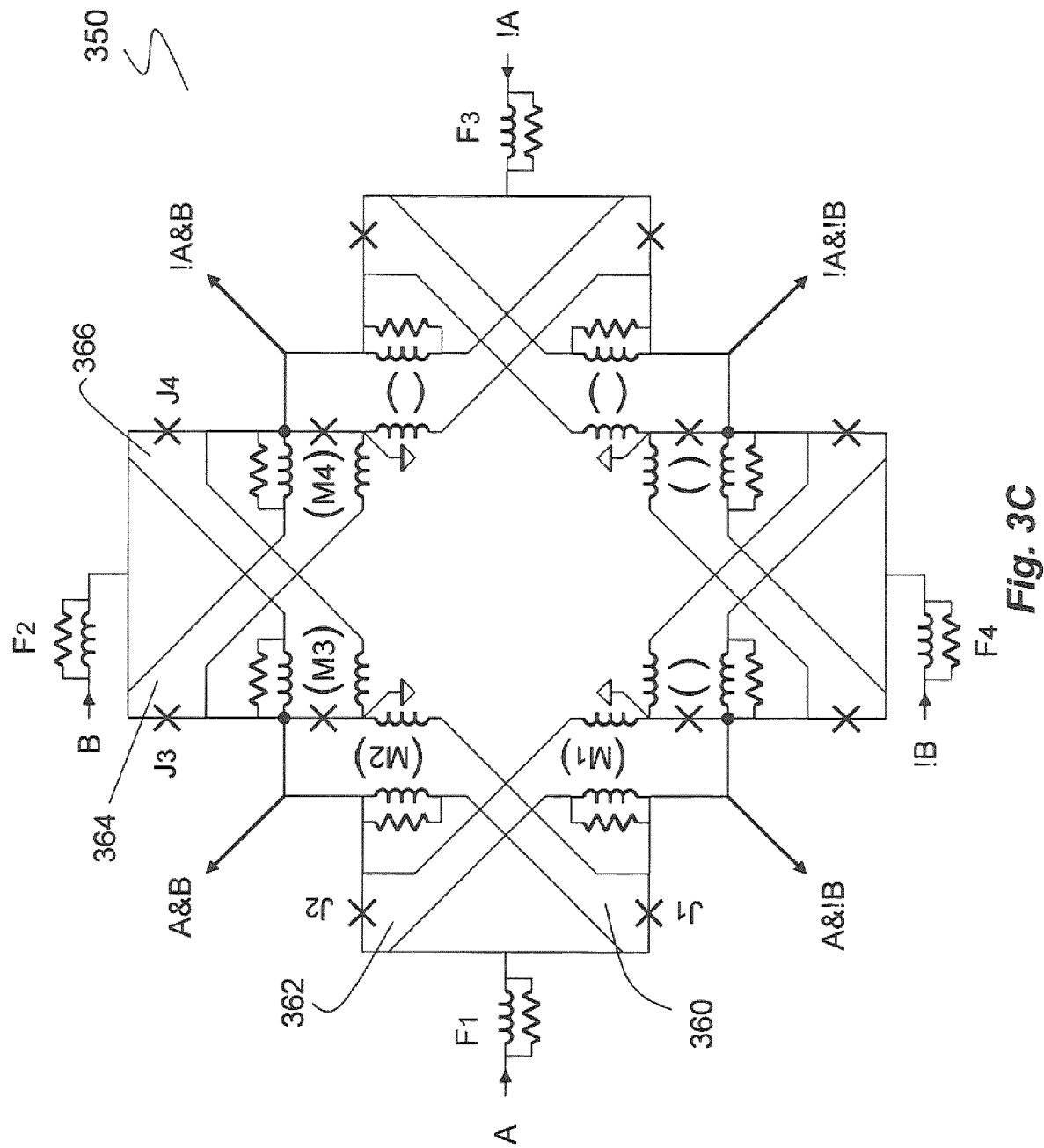
FIG. 3C is a circuit diagram for the ballistic dual-rail branch join gate of FIG. 3B according to an embodiment of the disclosure.

FIG. 3C is a circuit diagram for the ballistic dual-rail branch join gate of FIG. 3B. Circuit 350 of FIG. 3C receives input signals A, B, !A and !B and processes the signals through filters $F_1$, $F_2$, $F_3$ and $F_4$, respectively. Each of the two adjacent inputs shares an output node. For example, node 302 provides an output pulse train (A & B) at node 352. While not shown in FIG. 3C, the output nodes can have an output filter (see FIG. 3B) comprising a resistor connected in parallel to an inductor. Output node 354 provides an output pulse train of !A & B; output node 356 provides an output pulse train of !A & !B; and output node 358 provides an output pulse train of A & !B.

As with the merge gate of FIG. 2, various loop transformers are arranged to create favorable travel paths from input to output for the incoming SFQ. Mutual inductances $M_1$, $M_2$, $M_3$ and $M_4$ are identified to illustrate this point. The low provided by the mutual inductance connects an input pulse to the desired output node.

Figure 4:
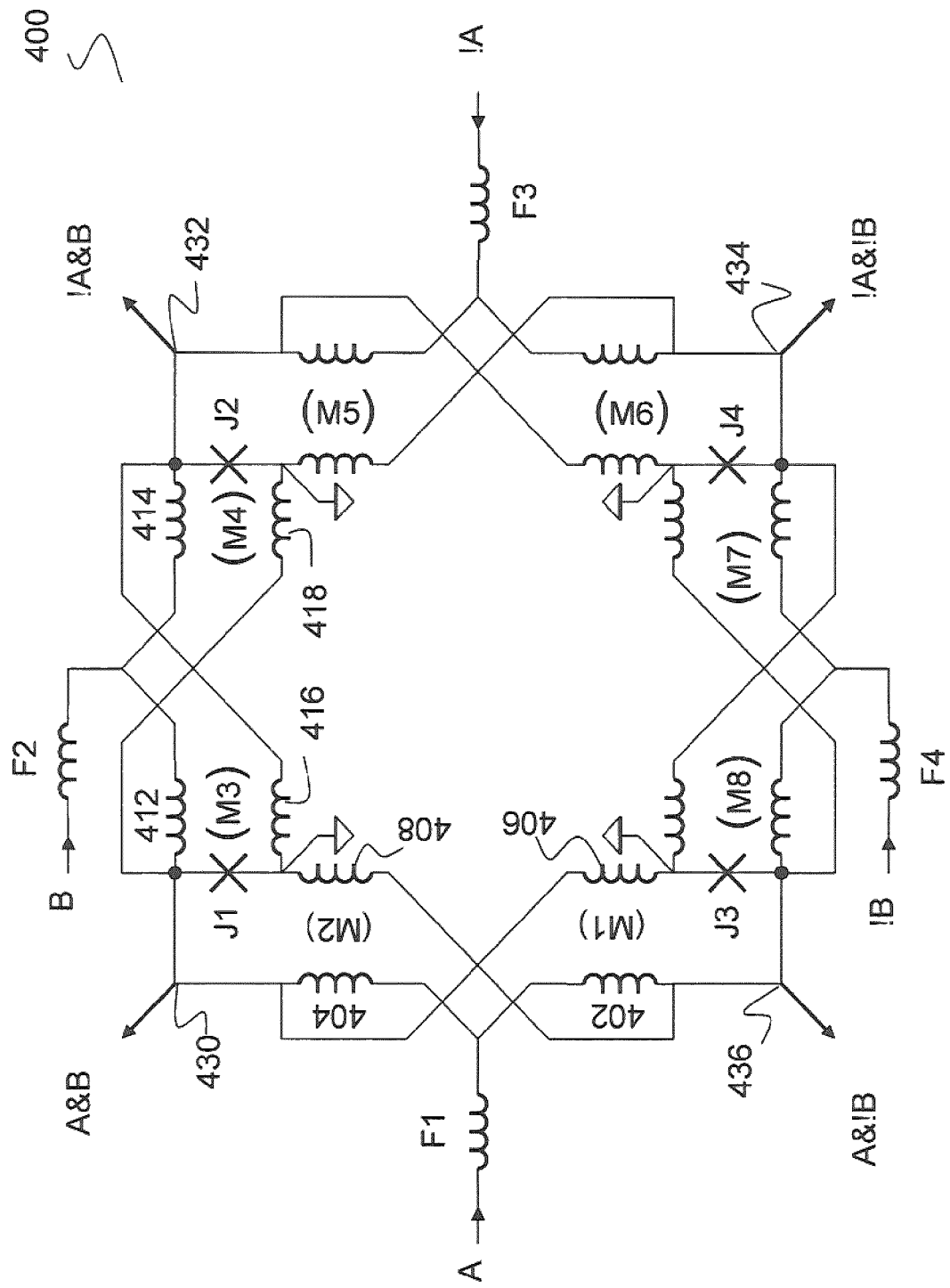
FIG. 4 shows a dual-rail ballistic join gate according to another embodiment of the disclosure.

FIG. 4 shows a dual-rail ballistic join gate according to another embodiment of the disclosure. Dual-rail ballistic join gate 400 includes input filters $F_1$, $F_2$, $F_3$ and $F_4$ and output nodes 430, 432, 434 and 436. As compared with the embodiment of FIG. 3C, each input filter comprises of an inductor. Here, the filter resistor is eliminated. The floating Josephson junctions are also eliminated. This is similar to removing junctions J3 and J4 in the merge gate of FIG. 2C.

An SFQ pulse A directed to input filter $F_1$ can have two identical paths. A first path can be through inductor 402 and the second path can be through inductor 404. As stated, the signal path that allows two input signals to merge will be the favored path. When an SFQ pulse at A coincides with an SFQ pulse at B, the signal path is through inductor 402 and Josephson junction $J_1$ will be triggered and the pulse will be directed to output 430. Similarly, the input pulse B is directed to input filter $F_2$ and to inductor 412. The SFQ pulses at A and B need not be received substantially simultaneously. As long as they are received within an acceptable window of time, the output will be directed as A & B.

On the other hand, if no pulse is received at filter $F_2$ when input pulse A is received, then SFQ pulse A has two equally viable paths through inductors 402 and 404. If input pulse A is received at the substantially the same time as input pulse !B, then inductive path 404 would direct triggering Josephson junction J3 and an output A & !B would be received at the output gate. Because circuit 400 is symmetric, the remainder of the circuit behaves similarly to the provided description and for brevity the operation of output gates 432 and 434 will not be discussed.

It should also be noted that circuit 400 can be powered by an AC or a DC power source as described above. When using a DC power source, the circuit can be constructed to have a DC current source and a shunt resistor. When using an AC power source, the circuit can be constructed with an AC power supply and a transformer. In one embodiment, the transformer provides a trapezoidal power signal to the circuit.

Figure 5:
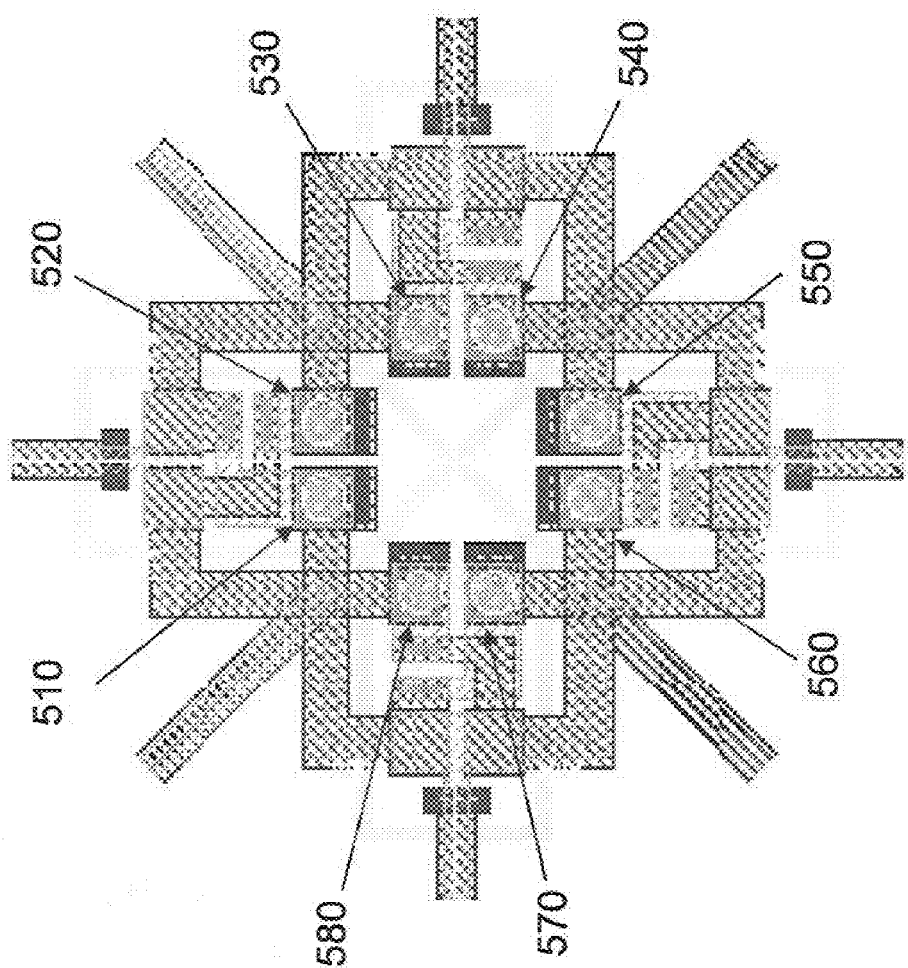
FIG. 5 shows a notational physical IC layout showing circuit topology for the ballistic join gate of FIG. 4.

FIG. 5 shows a notational physical IC layout showing circuit topology for the ballistic join gate of FIG. 4. Circuit 500 of FIG. 5 shows Josephson junctions 510, 520, 530, 540, 550, 560, 570 and 580.

Figure 6A:
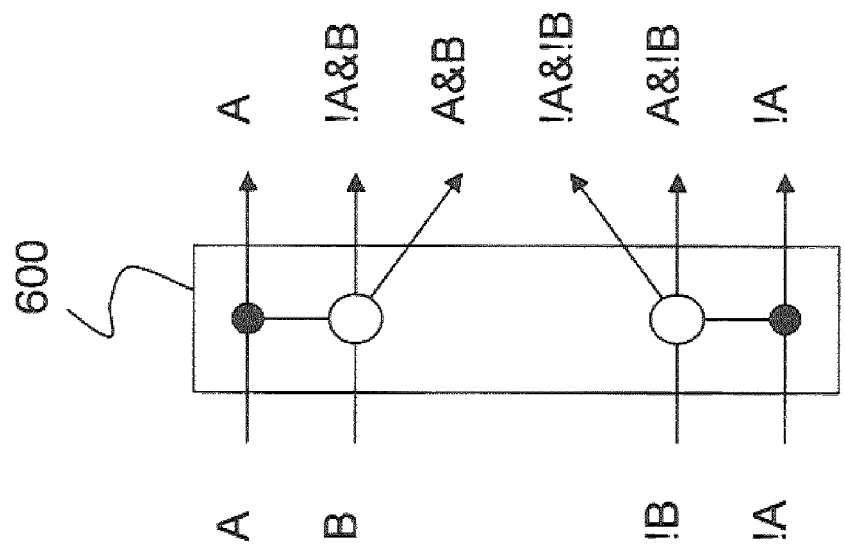
FIG. 6A is a symbolic representation of a dual-rail branch logic gate.

FIG. 6A is a symbolic representation of a dual-rail logic branch gate. The dual-rail logic branch gate of FIG. 6A can be used for reversible computation and signal encoding. The logic gate 600 receives inputs A, B, !B and !A. Outputs of logic gate 600 include A, !A & B, A & B, !A & !B, A & !B and !A.

Figure 6B:
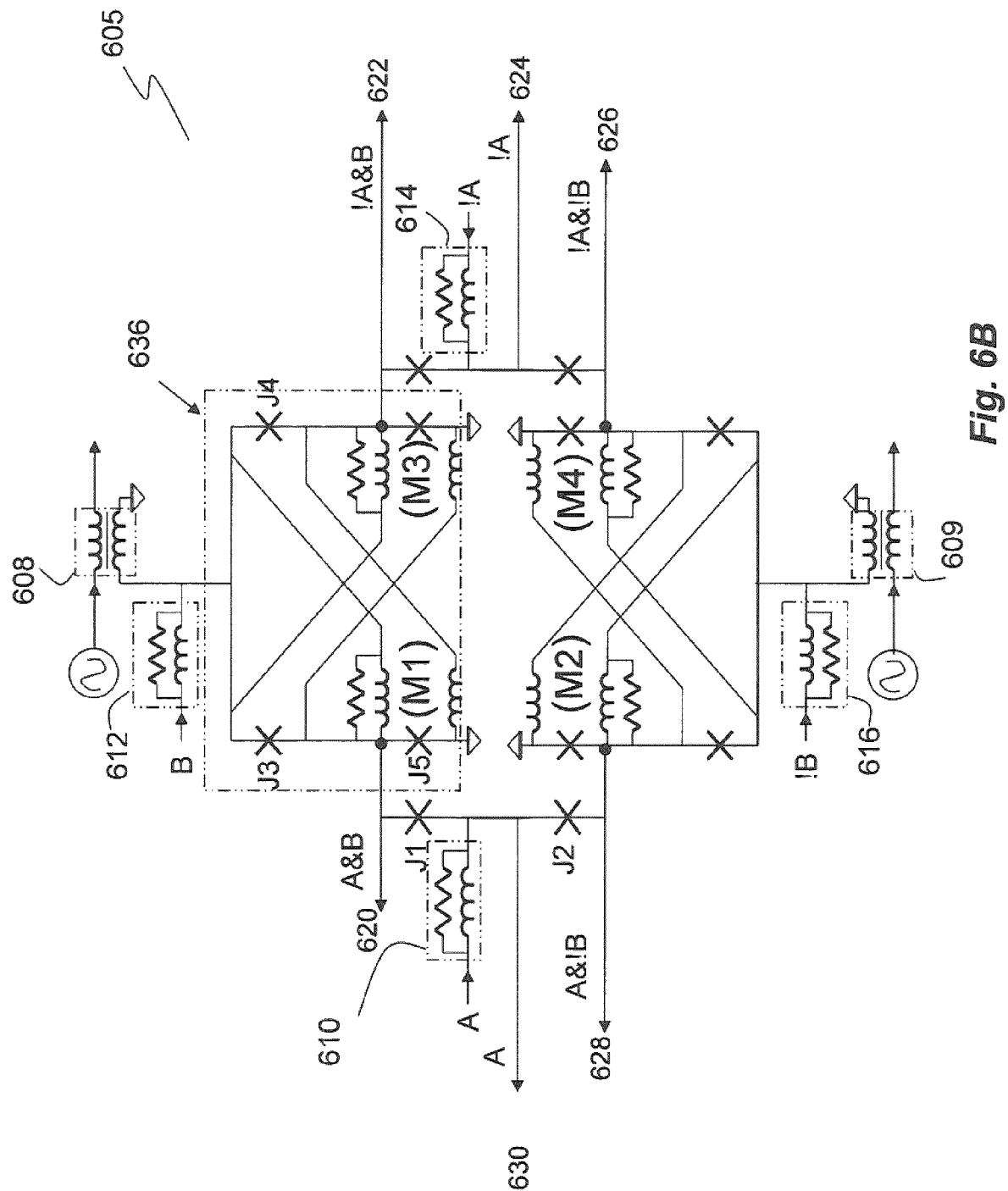
FIG. 6B shows a dual rail branch gate circuit according to one embodiment of the disclosure.

FIG. 6B shows a dual rail branch gate according to one embodiment of the disclosure. The dual branch gate of FIG. 6B can be considered as two merge gates (such as those described above) coupled together. Circuit 605 of FIG. 6B can implement the symbolic representation of FIG. 6A. As in FIG. 6A, circuit 605 receives input pulses A, B, !A and !B at input filters 610, 612, 614 and 616. Power is provided to the circuits through AC power sources and transformers 608 and 609. Circuit outputs include A, A & B, !A & B, !A, !A & !B and A & !B.

Exemplary input pulse A, is received at input filter 610 and can be directed to Josephson junctions J1 or J2. An additional input can steer pulse A to a desired output. The additional input can be considered as an auxiliary input. An input pulse A can be steered to J1 and directed to output 620 if sufficient bias is provided by the loop transformers affecting the input pulse. In circuit 605, an auxiliary input pulse can direct signal pulses A and B to output 620.

Figure 7B:
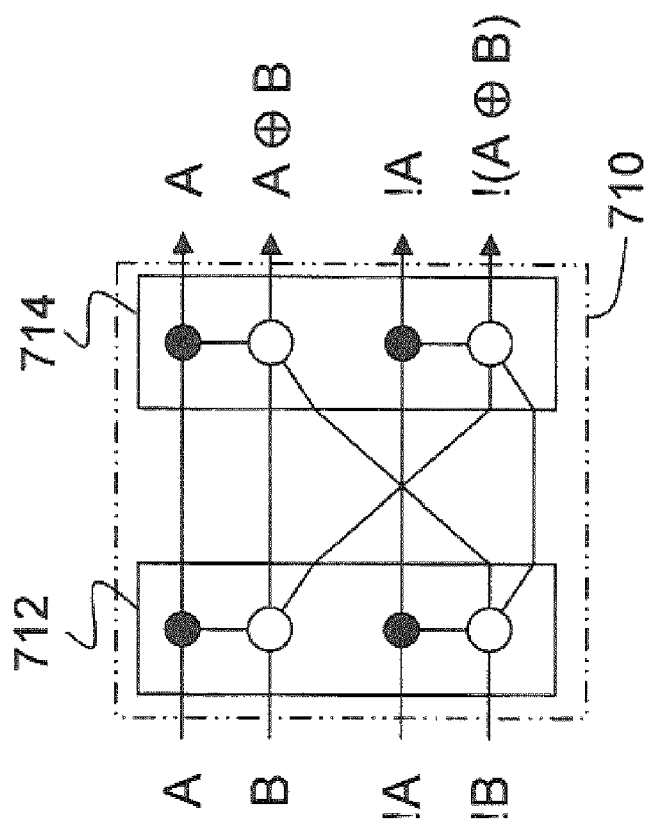
FIG. 7B symbolically shows a CNOT logic gate which can be implemented by using branch gates disclosed herein.
Figure 7A:
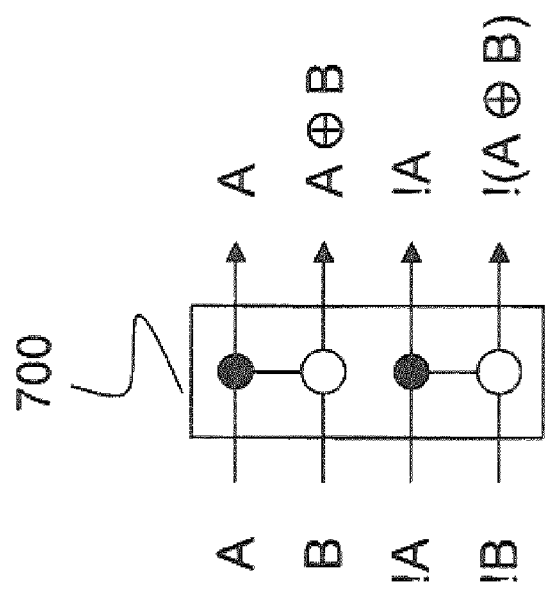
FIG. 7A symbolically shows a CNOT gate which can be implemented as a reversible dual-rail logic unit using the circuit configurations of FIGS. 3-6.

FIG. 7A symbolically shows a CNOT gate which can be implemented as a reversible dual-rail logic unit using the circuit configurations of FIGS. 6B. The CNOT gate of FIG. 7A has inputs A and B. Separate inputs for !A and !B can be provided. Alternatively, inputs A and B can be converted to !A and !B according to the principles disclosed herein. Outputs of the CNOT gate are A, A.sym.B, !A and !(A.sym.B).

FIG. 7B symbolically shows a CNOT logic gate implementation using branch gates. The inputs to CNOT logic gate 710 are pulse signals A, B, !A and !B, and the outputs include A, A.sym.B, !A and !(A.sym.B). The implementation of FIG. 7B has the same input as that of FIG. 7A. However, in contrast with FIG. 7A, the logic gate is implemented as forward branch gate 712 and backward branch gate 714 arranged in series. Dual branch gates such as those illustrated in FIG. 6B can be used for this implementation.

Figure 7C:
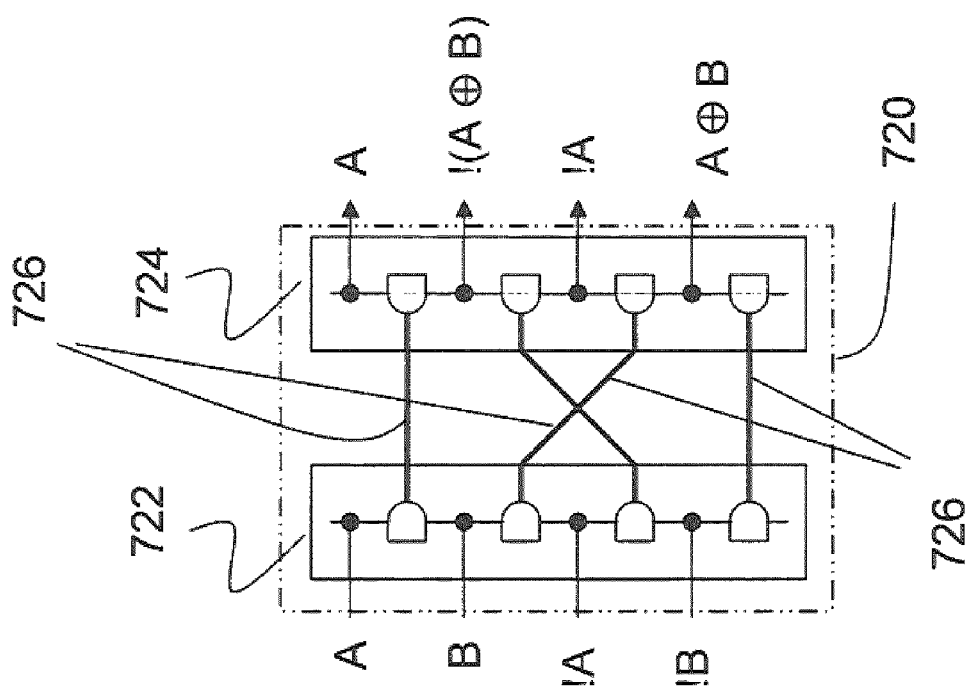
FIG. 7C symbolically shows a CNOT gate which can be implemented using join gates as disclosed herein.

FIG. 7C symbolically shows a CNOT gate implementation using join gates. Logic unit 720 comprises forward join gate 722 and backward join gate 724 connected in series. Join gates 722 and 724 can be similar to those illustrated in FIGS. 3A-3C. The inputs to join gate 722 include SFQ pulses A, B, !A and !B and the output includes A, A.sym.B, !A and !(A.sym.B). Connection lines 726 can be sized to provide twice the signal energy.

Figures 8A, 8C:
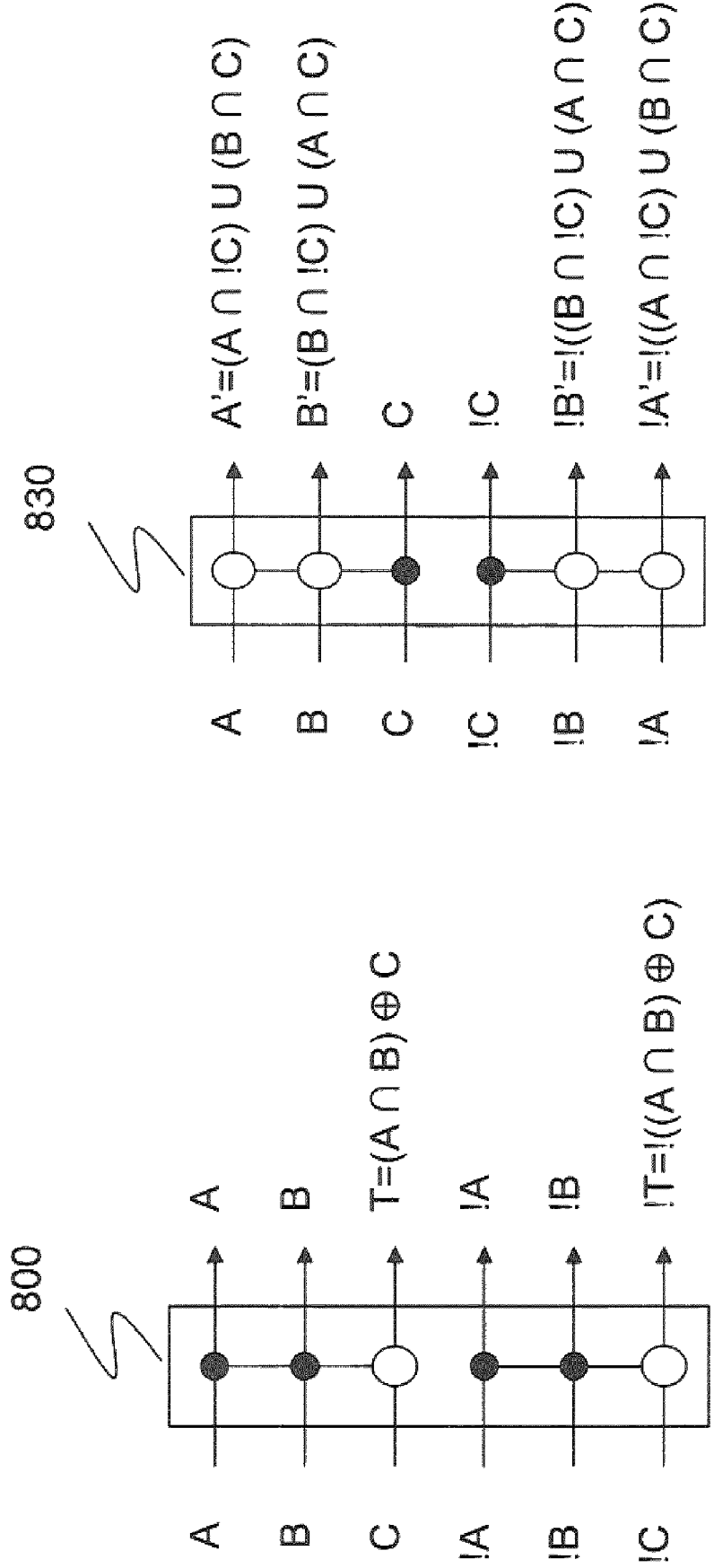
FIG. 8A symbolically illustrates a reversible dual-rail Toffoli logic gate which can be constructed using branch gates according to the principles of the invention.
FIG. 8C symbolically illustrates a reversible dual-rail Fredkin gate which can be constructed using the principles of the invention.

FIGS. 8A-8D are directed to a universal logic family. Specifically, FIG. 8A shows a Toffoli logic gate which can be constructed according to the embodiments disclosed herein. Logic gate 800 is a universal reversible logic gate having SFQ input pulses A, B, C, !A, !B and !C. The outputs are A, B, T, !A, !B and !T; wherein T and !T are defined in the following equations:

$$T = (A.\text{andgate}.B).\text{sym}.C \quad (1)$$

$$!T = !((A.\text{andgate}.B).\text{sym}.C) \quad (2)$$

Figure 8B:
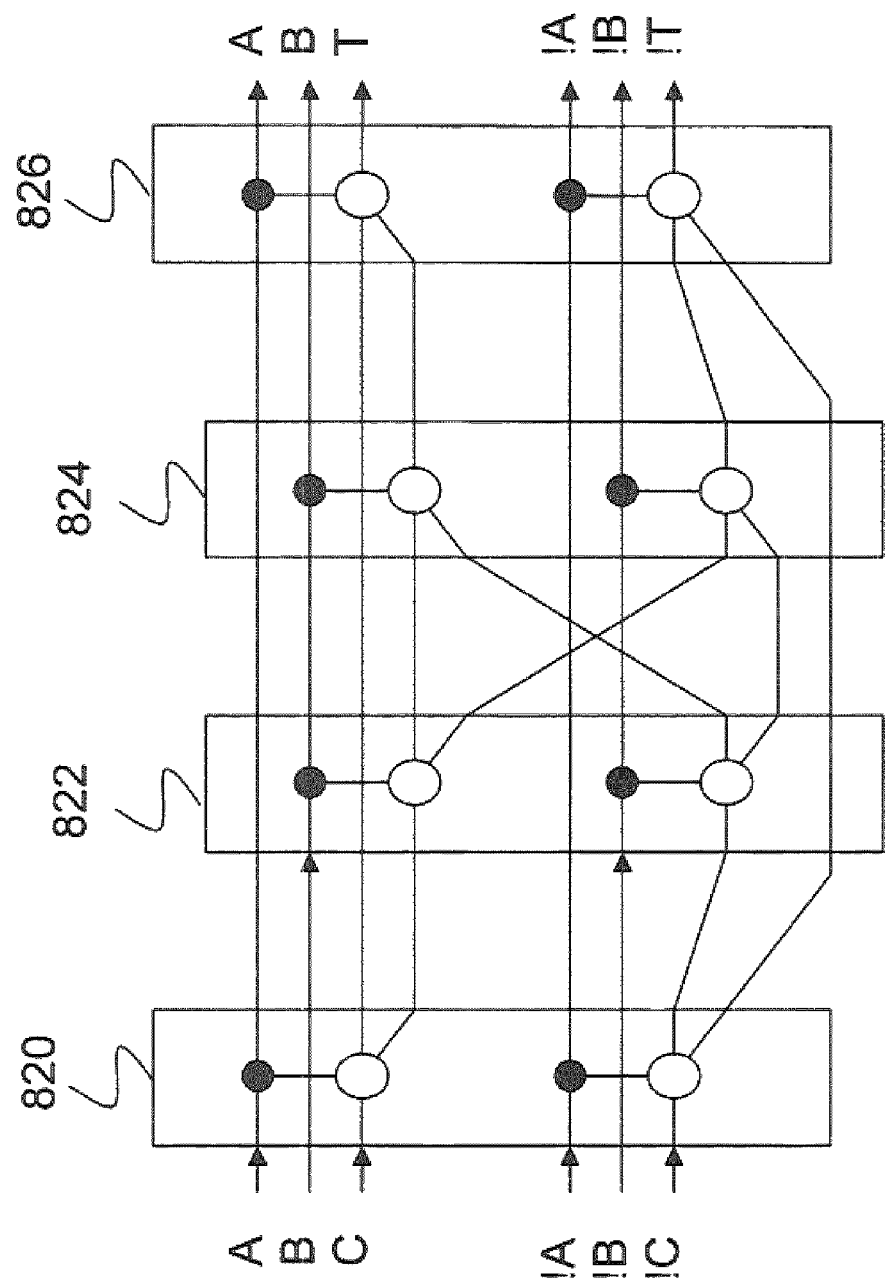
FIG. 8B symbolically illustrates reversible dual-rail Toffoli implementation of FIG. 8A using two pairs of branch and reverse branch gates as disclosed herein.

FIG. 8A extends the principles of the disclosure to a logic gate having three inputs. FIG. 8B symbolically illustrates the Toffoli implementation of FIG. 8A using two pairs of branch and reverse branch gates. As in FIG. 8A, the inputs to branch logic gate include A, B, C, !A, !B and !C. Branch logic gate 820 can be wired according to the principles disclosed herein. Logic gates 822 and 824 define reverse branch gates and logic gate 826 defines a branch gate providing outputs A, B, T, !A, !B and !T.

FIG. 8C symbolically illustrates a reversible dual-rail Fredkin gate which can be constructed using the principles of the invention. The inputs to logic unit 830 includes A, B, C, !C, !B and !A. The outputs are A', B', C, !C, !B' and !A', wherein A', B', !B' and !A' are defined in the following equations:

$$A' = (A.\text{andgate}.!C)U(B.\text{andgate}.C) \quad (3)$$

$$B' = (B.\text{andgate}.!C)U(A.\text{andgate}.C) \quad (4)$$

$$!B' = !((B.\text{andgate}.!C)U(A.\text{andgate}.C)) \quad (5)$$

$$!A' = !((A.\text{andgate}.!C)U(B.\text{andgate}.C)) \quad (6)$$

Figure 8D:
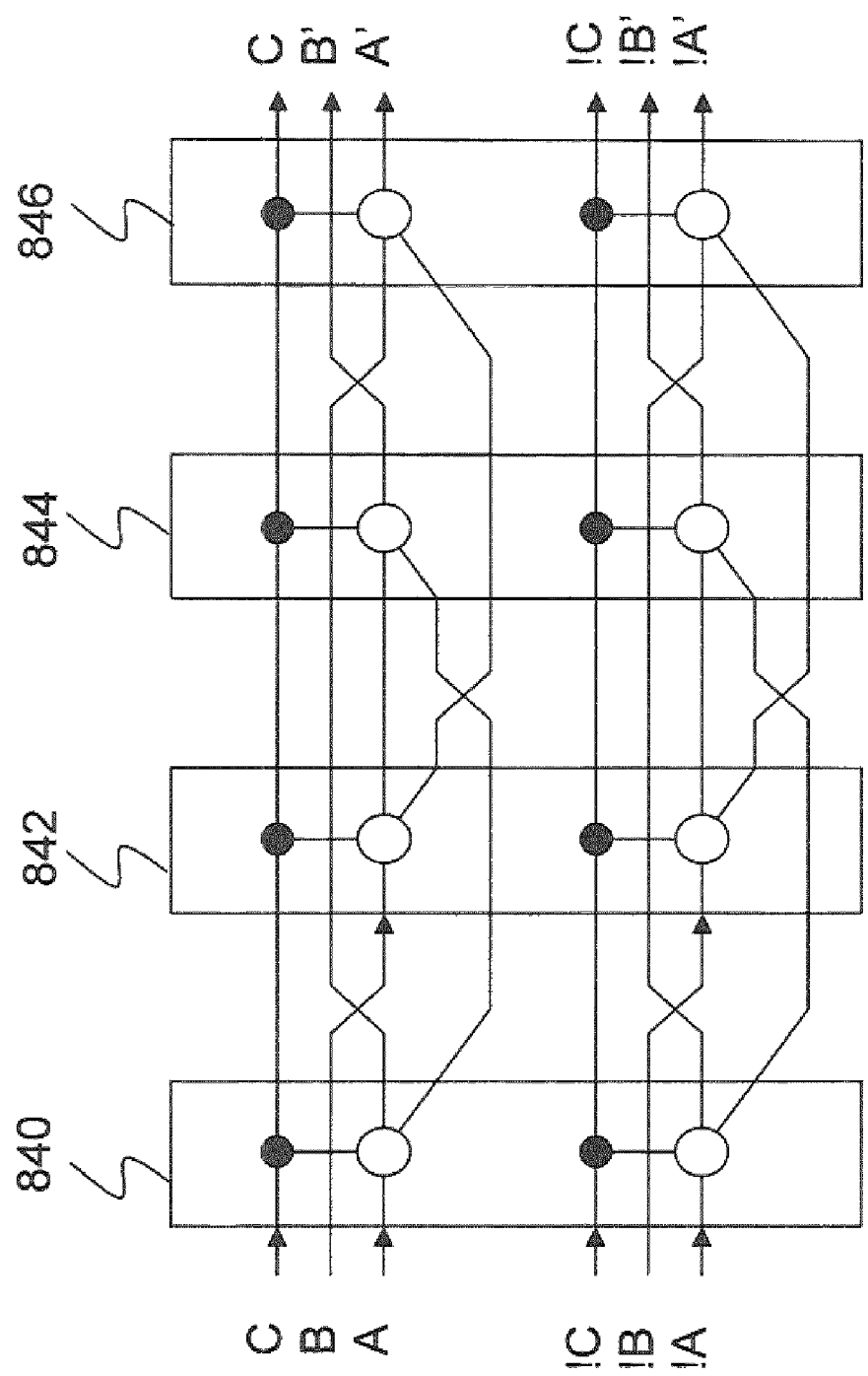
FIG. 8D symbolically illustrates a reversible dual-rail logic implementation of FIG. 8C using two pairs of branch and reverse branch gates.

FIG. 8D symbolically illustrates a reversible dual-rail logic implementation of FIG. 8C using two pairs of branch and reverse branch gates. Logic gates 840 and 846 define branch logic gates similar to those presented herein. Logic gates 842 and 846 define reverse branch gates. The input to logic gate 840 includes C, B, A, !C, !B and !A. Outputs of logic gate 846 include C, B', A', !C, !B' and !A'.

Figure 9:
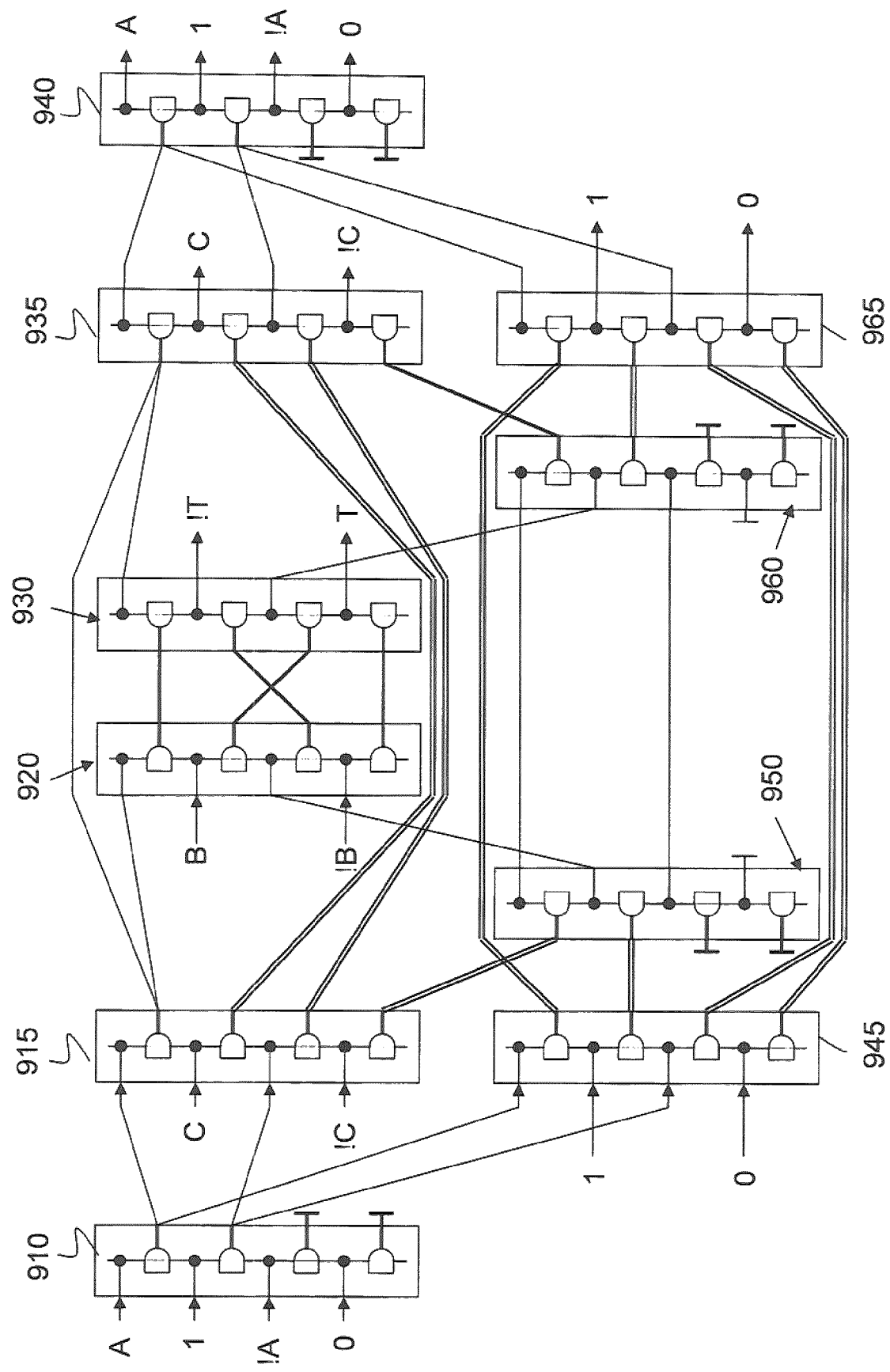
FIG. 9 symbolically illustrates a reversible dual-rail Toffoli gate implementation which can be constructed using join gates disclosed herein.

FIG. 9 symbolically illustrates a reversible dual-rail Toffoli gate implemented using join gates according to the principles of the invention. The inputs to logic gate 910 include A, 1, !A and 0. The inputs to logic gate 915 are C and !C. The inputs to logic gate 920 are B and !B and the inputs to logic gate 945 are 1 and 0. The outputs of logic gate 930 are T and !T, wherein T and !T are defined according to equations (1) and (2) above. The outputs of logic unit 940 are A, 1, !A and 0 and the output of logic gate 965 are 1 and 0. In FIG. 9, connection lines that are represented by double-line are large connectors for providing double the signal energy. FIG. 9 shows that join gates according to the disclosed principles can be used to form a reversible universal dual-rail gate.

While the principles of the disclosure have been illustrated in relation to the exemplary embodiments shown herein, the principles of the disclosure are not limited thereto and include any modification, variation or permutation thereof.

What is claimed:

1. A single flux quantum (SFQ) signal transmission line, comprising:
    a transformer having a primary winding and a secondary winding, the primary winding receiving an AC signal;
    a filter circuit having a resistor connected and an inductor, the filter circuit receiving an input SFQ pulse;
    a first Josephson junction connected to the filter circuit and to the secondary winding, the Josephson junction triggering responsive to the SFQ pulse and regenerating the pulse signal power responsive to a discharge from the secondary winding.

2. The SFQ signal transmission line of claim 1, further comprising a plurality of Josephson junctions connected in parallel to the first Josephson junction.

3. The SFQ signal transmission line of claim 1, wherein the first Josephson junction is grounded at one end.

4. The SFQ signal transmission line of claim 1, wherein the inductor and the resistor of the filter circuit are connected in parallel.

5. The SFQ signal transmission line of claim 1, wherein the filter circuit removes a harmonic signal affecting the signal transmission line.

6. The SFQ signal transmission line of claim 1, wherein the transformer provides AC power to the Josephson junction.

7. A single flux quantum (SFQ) signal transmission line, comprising:
    a first plurality of fully ballistic Josephson junction transmission line (JTL) stages coupled to a second plurality of fully ballistic JTL stages by a dampening resistor, each of the fully ballistic JTL stages of the first and second plurality of fully ballistic JTL stages being configured to receive an input SFQ pulse and regenerate the input pulse to a subsequent stage.

8. The SFQ signal transmission line of claim 7, wherein each of the fully ballistic JTL stages of the first and second plurality of fully ballistic JTL stages comprises a series coupled inductor and Josephson junction.

9. The SFQ signal transmission line of claim 7, wherein each of the fully ballistic JTL stages of the first and second plurality of fully ballistic JTL stages is devoid of a power source, an input filter and a shunt resistor.

10. The SFQ signal transmission line of claim 7, wherein the first plurality of stages comprises at least 100 stages.

11. The SFQ signal transmission line of claim 10, wherein the first plurality of stages comprises at least 100 stages.

12. The SFQ signal transmission line of claim 7, wherein the first plurality of stages comprises at least 100 stages.

13. The SFQ signal transmission line of claim 12, wherein the first plurality of stages comprises at least 1000 stages.

* * * * *